United States Patent
Liaw

(10) Patent No.: US 7,119,023 B2
(45) Date of Patent: Oct. 10, 2006

(54) PROCESS INTEGRATION OF SOI FETS WITH ACTIVE LAYER SPACER

(75) Inventor: Jhon Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 152 days.

(21) Appl. No.: 10/687,424

(22) Filed: Oct. 16, 2003

(65) Prior Publication Data

US 2005/0085081 A1    Apr. 21, 2005

(51) Int. Cl.
*H01L 21/302* (2006.01)
(52) U.S. Cl. .................... 438/719; 438/706
(58) Field of Classification Search ........ 438/700, 438/702, 703, 706, 710, 714, 719, 724
See application file for complete search history.

(56) References Cited

U.S. PATENT DOCUMENTS

| | | | | |
|---|---|---|---|---|
| 5,039,621 A | * | 8/1991 | Pollack | 438/164 |
| 5,219,783 A | * | 6/1993 | Moslehi | 438/420 |
| 5,610,083 A | * | 3/1997 | Chan et al. | 438/155 |
| 6,004,831 A | * | 12/1999 | Yamazaki et al. | 438/30 |
| 6,100,151 A | * | 8/2000 | Park | 438/318 |
| 6,150,286 A | * | 11/2000 | Sun et al. | 438/791 |
| 6,225,147 B1 | * | 5/2001 | Noble | 438/149 |
| 6,465,296 B1 | * | 10/2002 | Quek et al. | 438/233 |
| 6,555,442 B1 | | 4/2003 | Pai et al. | |
| 6,657,261 B1 | * | 12/2003 | Assaderaghi et al. | 257/354 |
| 2004/0241981 A1 | * | 12/2004 | Doris et al. | 438/637 |

OTHER PUBLICATIONS

S.Wolf "Silicon Processing for the VLSI Era", 1990, vol. 2, pp. 354-355.*
Merriam-Webster's Collegiate Dictionary, tenth edition, p. 827.*

* cited by examiner

*Primary Examiner*—Kin-Chan Chen
(74) *Attorney, Agent, or Firm*—Haynes and Boone, LLP

(57) ABSTRACT

A method of manufacturing a microelectronics device including providing a substrate having an active layer, a dielectric layer and a structural layer, wherein the active layer is formed over the dielectric layer and the dielectric layer is formed over the structural layer. The method further includes forming an opening through the active layer thereby exposing a surface of the dielectric layer and defining active layer sidewalls. A spacer is formed covering a first portion of the exposed dielectric layer surface and substantially spanning one of the active layer sidewalls. At least a second portion of the exposed dielectric layer surface is then cleaned.

22 Claims, 3 Drawing Sheets

PROCESS INTEGRATION OF SOI FETS WITH ACTIVE LAYER SPACER

BACKGROUND

The present disclosure relates generally to methods of manufacturing semiconductor devices and, more specifically, to methods of manufacturing a semiconductor device having an active layer spacer.

Semiconductor device geometries continue to dramatically decrease in size since such devices were first introduced several decades ago. Today's fabrication plants are routinely producing devices having feature dimensions less than 90 nm. This reduction in size has helped to reduce manufacturing costs and provide greater electronic device speed and capabilities.

As device sizes shrink, the materials and processes used in fabrication must adapt to achieve more challenging specifications. One recent improvement is the adoption of silicon-on-insulator (SOI) substrates over the former industry standard of silicon substrates. SOI substrates can be generally formed by oxidizing an insulating layer formed over a handle or structural portion of a substrate. The oxidizing process may include rapid thermal processing (RTP), implantation of oxygen ions and/or other processes known to those skilled in the art. SOI substrates provide improved electrical isolation between individual devices of an integrated circuit, which allows for operation of these devices at higher cycling frequencies and faster device operating speeds. SOI substrates also provide a significant reduction in parasitic capacitance which can often lead to problems with device operation.

However, the adoption of SOI substrates has presented problems. In some applications, employing SOI substrates can lead to the contamination of device active areas. For example, wet etching processes typically employed to pattern blanket-deposited layers and to clean partially completed devices at intermediate stages of manufacture can over-etch the insulator layer of an SOI substrate, often causing undercut regions to form in the insulator layer under device gates, active regions and other patterned components. The undercut regions can accumulate residue during their formation and subsequent processing. The residue may comprise polymer resist, polysilicon, silicides, oxides and/or other processing materials. The trapped residue can contribute to transistor latch-up. The residue can also lead to pin holes and other defects in components formed over or around the undercut regions, possibly leading to excessive current leakage, threshold breakdown and/or device failure. The reliability of devices may also fall victim to these shortcomings. Moreover, such problems are exasperated as microelectronic devices experience continued scaling.

Accordingly, what is needed in the art is a microelectronics device and a method of manufacture thereof that addresses the above-discussed issues.

SUMMARY

The present disclosure introduces a method of manufacturing a microelectronics device including providing a substrate having an active layer, a dielectric layer and a structural layer, wherein the active layer is formed over the dielectric layer and the dielectric layer is formed over the structural layer. An opening is formed through the active layer thereby exposing a surface of the dielectric layer and defining active layer sidewalls. A spacer is formed covering a first portion of the exposed dielectric layer surface and substantially spanning one of the active layer sidewalls. At least a second portion of the exposed dielectric layer surface is then cleaned.

The present disclosure also introduces a microelectronics device. The microelectronics device includes a substrate having a structural layer, a dielectric layer located over the structural layer, and an active layer located over the dielectric layer. An opening extends through the active layer thereby exposing a surface of the dielectric layer and defining active layer sidewalls. A spacer covers a first portion of the exposed dielectric layer surface and substantially spans one of the active layer sidewalls. The microelectronics device also includes a semiconductor device located at least partially over the active layer.

An integrated circuit device is also provided by the present disclosure. In one embodiment, the integrated circuit device includes a substrate having a structural layer, a dielectric layer located over the structural layer, and an active layer located over the dielectric layer. A plurality of openings each extend through the active layer thereby exposing a surface of the dielectric layer and defining a plurality of active layer islands each having sidewalls. A plurality of spacers each cover a portion of the exposed dielectric layer surface and substantially span one of the plurality of active layer sidewalls. The integrated circuit device also includes a plurality of semiconductor devices each located at least partially over a corresponding one of the plurality of active layer islands. At least one interconnect electrically connects ones of the plurality of semiconductor devices The foregoing has outlined preferred and alternative features of several embodiments so that those skilled in the art may better understand the detailed description that follows. Additional features will be described below that further form the subject of the claims herein. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
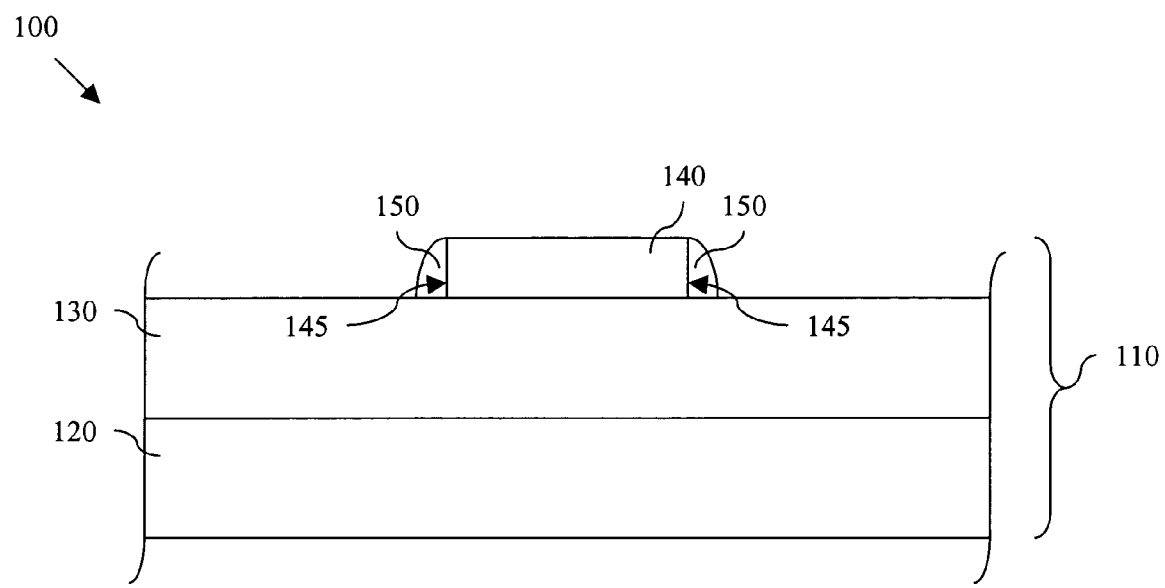
FIG. 1 illustrates a sectional view of one embodiment of a microelectronics device in an intermediate stage of manufacture according to the aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of one embodiment of a microelectronics device 100 constructed according to aspects of the present disclosure. The microelectronics device 100 includes or is formed from or in a substrate 110. The substrate 110 may be a silicon-on-insulator (SOI) substrate. For example, the substrate 110 may include a structural layer 120, a dielectric layer 130 located over the structural layer 120, and an active layer 140 located over the dielectric layer.

The structural layer 120 may comprise silicon, gallium arsenide, silicon germanium, diamond and/or other materials. The dielectric layer 130 may be grown or otherwise formed from the structural layer 120, such as by employing an oxygen ion implant process to form the dielectric layer 130 embedded in the structural layer 120. The dielectric layer 130 may comprise silicon dioxide, low-k dielectric, diamond and/or other materials, and may be formed by chemical-vapor deposition (CVD), plasma-enhanced CVD (PECVD), atomic layer deposition (ALD) and/or other processes.

The active layer 140 may comprise silicon, silicon germanium, germanium, strained silicon and/or other materials, and may have a thickness ranging between about 100 Angstroms and about 1000 Angstroms. The active layer 140 and/or the structural layer 120 may also be positively (p-type) or negatively (n-type) doped. For example, phosphorous (or other n-type impurities) or boron (or other p-type impurities) may be implanted in the active layer 140 and/or the structural layer 120 by ion implantation, gaseous diffusion, CVD, PECVD, ALD and/or other processes.

The active layer 140 may also comprise doped silicon, strained silicon, silicon germanium, doped gallium arsenide, diamond and/or other materials. In one embodiment, the active layer 140 includes a stack of layers. For example, the active layer 140 may comprise a silicon layer, a silicon germanium layer over the silicon layer, and a strained silicon layer over the silicon germanium layer. Of course, other combinations of materials may be employed to form a stack of layers comprising the active layer 140 within the scope of the present disclosure.

The active layer 140 may be etched or otherwise patterned to form active layer sidewalls 145, possibly achieving the shape shown in FIG. 1, although other shapes are within the scope of the present disclosure. Consequently, a portion of the dielectric layer 130 may be exposed near the patterned active layer 140, including adjacent the active layer sidewalls 145. In general, the active layer 140 is patterned to form one or more islands from the active layer 140, such that one or more semiconductor or other microelectronic devices may be formed on or from each of the islands defined in the active layer 140. The active layer 140 may be patterned by photo-lithography, direct e-beam writing, contact printing, reactive ion etching (RIE), microwave electron cyclotron resonance (ECR) and/or other processes, which may utilize inductively coupled plasma (ICP), helicon plasma and/or other plasmas. The active layer 140 may also be etched by a dry or plasma process, possibly employing an etch chemistry containing fluorine and/or a fluorine containing gas, such as a perfluorocarbon. The etch process may also include a chemical-clean, possibly including one or more wet etch processes employing hydrofluoric (HF) acid and/or other etchant chemistries. The chemical-clean may also include rinsing with deionized water (DI water) and/or other cleaners.

The microelectronics device 100 also includes spacers 150. The spacers 150 maybe formed from a blanket oxide layer deposited or otherwise formed over the active layer 140 and the dielectric layer 130. The oxide layer may comprise silicon dioxide, silicon nitride and/or other dielectric materials, including high-temperature dielectric materials having low out-gassing properties. The oxide layer may be etched or otherwise patterned to form the spacers 150. Consequently, the spacers 150 may cover a portion of the dielectric layer 130 exposed around the active layer 140, and may also substantially span the active layer sidewalls 145.

The spacers 150 may be formed from the blanket oxide layer by photo-lithography, direct e-beam writing, contact printing, RIE, microwave ECR and/or other processes, which may utilize ICP, helicon plasma and/or other plasmas. The spacers 150 may also be etched by a dry or plasma process, possibly employing an etch chemistry containing fluorine and/or a fluorine containing gas, such as a perfluorocarbon. The etch process may also include a chemical-clean, possibly including one or more wet etch processes employing HF acid and/or other etchant chemistries. The chemical-clean may also include rinsing with DI water and/or other cleaners.

The spacers 150 may protect the active layer 140 and the dielectric layer 130 from subsequent cleaning and/or etching processes. In one embodiment, the spacers 150 may prevent the dielectric layer 130 and/or the active layer 140 from becoming undercut during subsequent processing such as chemical or dry etching. The spacers 150 may also substantially fill in, seal and/or passivate any undercut or over-etched regions formed in the dielectric layer 130 while the active layer 140 was patterned. Accordingly, the spacers 150 may also prevent the residue accumulation discussed above.

Figure 2:
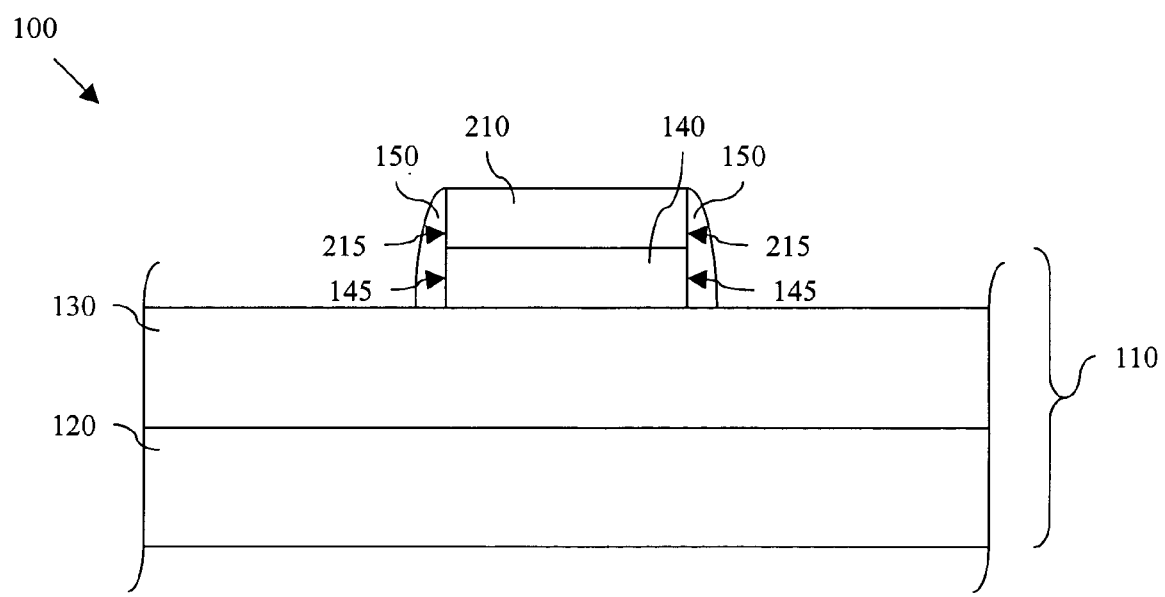
FIG. 2 illustrates a sectional view of the microelectronics device shown in FIG. 1 in an optional, subsequent stage of manufacture.

Referring to FIG. 2, illustrated is a sectional view of the microelectronics device 100 shown in FIG. 1 in a subsequent stage of manufacture, although the illustrated stage of manufacture is optional. That is, in the illustrated embodiment of FIG. 2, the microelectronics device 100 further includes an optional etch stop layer 210. The etch stop layer 210 may comprise silicon nitride, silicon oxy-nitride, silicon dioxide, TEOS and/or other materials, and may be formed by CVD, PECVD, ALD and/or other processes. The etch stop layer 210 may be employed to fix an end point of subsequent processing. For example, the etch stop layer 210 may be more or less selective to subsequently employed etching chemistries than surrounding components, or may provide a harder material for indicating a desired planarization end point.

In one embodiment, the etch stop layer 210 maybe formed over the active layer 140 before the active layer 140 is patterned to form the active layer sidewalls 145, such that the etch stop layer 210 may be patterned during the same process employed to pattern the active layer 140. Consequently, etch stop layer sidewalls 215 may be formed substantially concurrently with the formation of the active layer sidewalls 145. Moreover, the etch stop layer sidewalls 215 may be substantially aligned with the active layer sidewalls 145. However, in another embodiment, the etch stop layer 210 may be deposited and patterned after the active layer 140 is patterned to form the active layer sidewalls 145, such that the etch stop layer sidewalls 215 may not be aligned with the active layer sidewalls 145.

After patterning the active layer 140, as shown in FIG. 1, or after optionally patterning the active layer 140 and the etch stop layer 210, as shown in FIG. 2, the microelectronics device 100 may undergo a cleaning process prior to subsequent processing. For example, the exposed surface of the dielectric layer 130 and other exposed surfaces of the microelectronics device 100 may be cleaned by etching with a dry or plasma process, possibly employing an etch chemistry containing fluorine and/or a fluorine containing gas, such as a perfluorocarbon. Vapor etching may also be performed during the cleaning process. Such vapor etching may include introducing a vapor from a liquid precursor such as hydrofluoric acid (HF), HF and alcohol, HF and water, hexafluoroacetylacetonate (HFAC) or other fluorine containing species. The cleaning process may also include a chemical-clean, possibly including one or more wet etch processes employing hydrofluoric (HF) acid and/or other etchant chemistries. The chemical-clean may also include rinsing with deionized water (DI water) and/or other cleaners.

Figure 3:
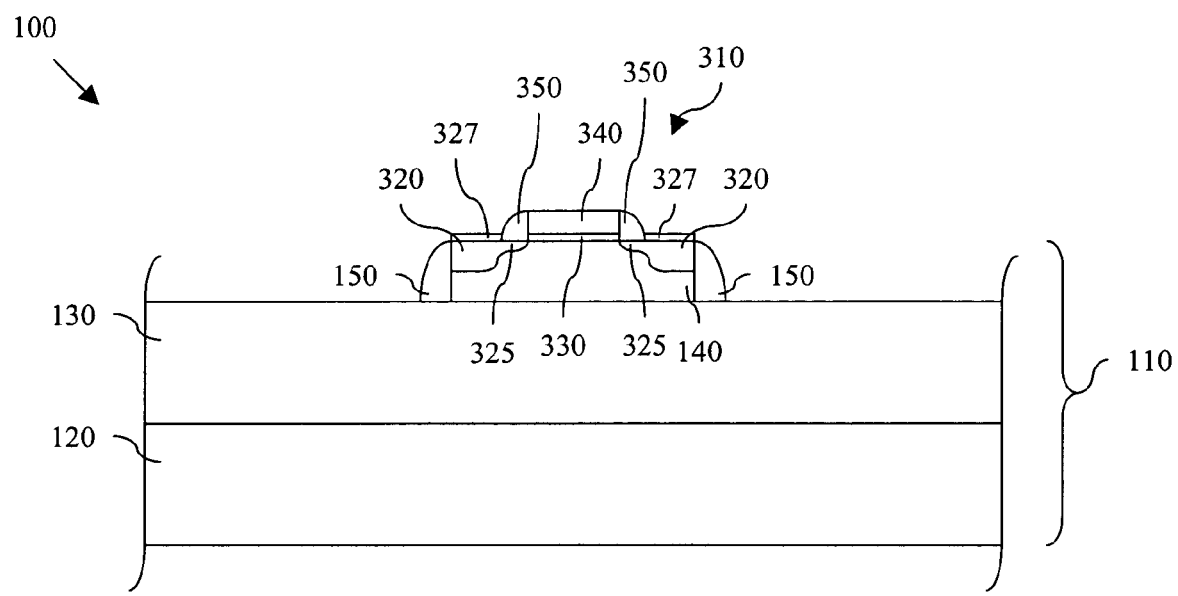
FIG. 3 illustrates a sectional view of the microelectronics device shown in FIG. 1 in a subsequent stage of manufacture.

Referring to FIG. 3, illustrated is a sectional view of the microelectronics device 100 shown in FIG. 1 and/or FIG. 2 in a subsequent stage of manufacture. The microelectronics device 100 may include a semiconductor device 310 formed in, from and/or over the active layer 140. Consequently, the semiconductor device 310 may be electrically isolated from the structural layer 120 by the dielectric layer 130. The semiconductor device 310 may be and/or include a metal-oxide-semiconductor field-effect-transistor (MOSFET), a flash device, an erasable programmable read-only memory (EPROM) device, an electrically erasable programmable read-only memory (EEPROM) device and/or other microelectronics devices.

In the illustrated embodiment, the semiconductor device 310 may be a MOSFET device and, therefore, may include source/drain regions 320 and a gate dielectric layer 330 in or on the active layer 140, a gate electrode 340 over the gate dielectric layer 330 and at least one spacer 350 adjacent the gate electrode 340 and the active layer 140. The source/drain regions 320 may be formed by ion implantation, thermal diffusion, plasma source ion implantation and/or other processes. The source/drain regions 320 may also include lightly-doped regions 325, and may further include a silicide contact layer 327 to reduce contact resistance. The silicide contact layer 327 may include nickel silicide, cobalt silicide, titanium silicide, tungsten silicide and/or other materials.

The gate dielectric layer 330 may comprise silicon dioxide, silicon oxy-nitride and/or other materials, and may have a thickness ranging between about 2 Angstroms and about 50 Angstroms. The gate electrode 340 may comprise poly-silicon, hafnium dioxide and/or other high-k dielectric materials. The spacers 350 may comprise one or more layers of silicon dioxide, silicon nitride, silicon carbide, and/or other materials. In general, the gate electrode 340 and/or the spacers 350 may be formed by etching or otherwise patterning layers formed by CVD, PECVD, ALD, and/or other processes.

Figure 4:
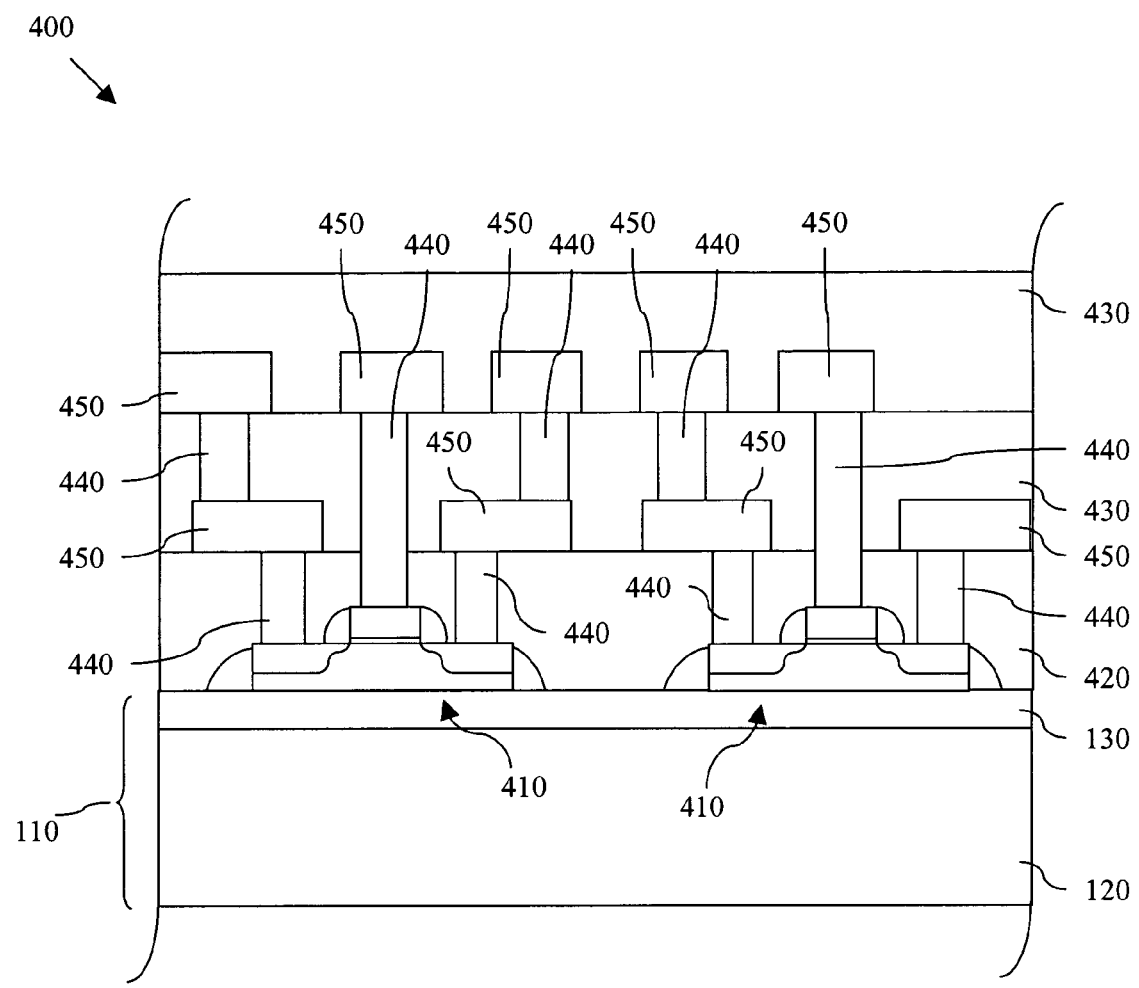
FIG. 4 illustrates a sectional view of one embodiment of an integrated circuit device constructed according to aspects of the present disclosure.

Referring to FIG. 4, illustrated is a sectional view of one embodiment of an integrated circuit device 400 constructed according to aspects of the present disclosure. The integrated circuit device 400 is one environment in which the microelectronics device 100 of FIG. 1, 2 or 3 may be incorporated. For example, the integrated circuit device 400 includes a plurality of semiconductor devices 410, wherein one or more of the semiconductor devices 410 may be substantially similar to the microelectronics device 100 of FIG. 1, 2 or 3. The semiconductor devices 410 may be formed from, in or on a common substrate 110 having a structural layer 120 and a dielectric layer 130, such as an SOI substrate. Of course, the semiconductor devices 410 may be formed from, in or on other substrates within the scope of the present disclosure.

The integrated circuit device 400 also includes one or more insulating layers 420, 430 located over the semiconductor devices 410. The first insulating layer 420, which may itself comprise multiple insulating layers, may be planarized to provide a substantially planar surface over the plurality of semiconductor devices 410.

The integrated circuit device 400 also includes vertical interconnects 440, such as conventional vias or contacts, and horizontal interconnects 450, such as conventional traces or runners. The interconnects 440 may extend through one or more of the insulating layers 420, 430, and the interconnects 450 may extend along one of the insulating layers 420, 430 or a trench formed therein. In one embodiment, one or more of the interconnects 440, 450 may have a dual-damascene structure. The interconnects 440, 450 may be formed by etching or otherwise patterning the insulating layers 420, 430 and subsequently filling the pattern with refractive and/or conductive material, such as tantalum nitride, copper and aluminum.

Although embodiments of the present disclosure have been described in detail, those skilled in the art should understand that they can make various changes, substitutions and alterations herein without departing from the spirit and scope of the present disclosure.

What is claimed is:

1. A method of manufacturing a microelectronic device, comprising:
   providing a substrate having an active layer, a dielectric layer and a structural layer, wherein the active layer is formed over the dielectric layer and the dielectric layer is formed over the structural layer;
   forming an opening through the active layer thereby exposing a surface of the dielectric layer and defining active layer sidewalls;
   cleaning the exposed surface of the dielectric layer, wherein the cleaning includes plasma cleaning employing an etch chemistry containing at least one of fluorine and a fluorine-containing gas, and then forming a spacer covering a portion of the cleaned, exposed dielectric layer surface and substantially spanning one of the active layer sidewalls; and
   forming a gate electrode over the active layer.

2. The method of claim 1 further comprising forming an etch stop layer over the active layer, wherein the opening is formed through the active layer and the etch stop layer thereby defining etch stop layer sidewalls substantially aligned with the active layer sidewalls, wherein the spacer substantially spans one of the active layer sidewalls, and one of the etch stop layer sidewalls, and wherein the cleaning is performed after forming the opening though the active layer and the etch stop layer and before forming the spacer.

3. The method of claim 1 wherein the cleaning further includes chemical etching with an etchant chemistry comprising hydrofluoric acid.

4. The method of claim 1 wherein the cleaning further includes vapor etching.

5. The method of claim 1 further comprising forming a silicide layer over the active layer.

6. The method of claim 1 wherein the spacer comprises silicon dioxide.

7. The method of claim 1 wherein the active layer comprises strained silicon.

8. The method of claim 1 wherein the active layer has a thickness ranging between about 100 Angstroms and about 1000 Angstroms.

9. The method of claim 1 wherein the active layer comprises a silicon layer, a silicon germanium layer, and a strained silicon layer, wherein the silicon germanium layer is located over the silicon Layer, and wherein the strained silicon layer is located over the silicon germanium layer.

10. The method of claim 1 wherein the active layer comprises a plurality of layers including a strained silicon layer.

11. The method of claim 1 wherein the active layer comprises a plurality of layers.

12. A method of manufacturing a microelectronic device, comprising:
    providing a substrate having:
        a structural layer;
        a dielectric layer located on the structural layer; and
        an active layer located on the dielectric layer;
    forming an opening through the active layer thereby exposing a surface of the dielectric layer and defining active layer sidewalls;
    cleaning the exposed surface of the dielectric layer, wherein the cleaning includes plasma cleaning employing an etch chemistry containing at least one of fluorine and a fluorine-containing gas, and then forming a spacer covering at least a portion of the cleaned, exposed dielectric layer surface and spanning at least a portion of the active layer sidewalls; and
    forming a gate electrode on the active layer.

13. The method of claim 12 further comprising forming an etch stop layer over the active layer, wherein the opening is formed through the active layer and the etch stop layer thereby defining etch stop layer sidewalls substantially aligned with the active layer sidewalls, wherein the spacer substantially spans one of the active layer sidewalls and one of the etch stop layer sidewalls, and wherein the cleaning is performed after forming the opening through the active layer and the etch stop layer and before forming the spacer.

14. The method of claim 12 wherein the cleaning further includes chemical etching with an etchant chemistry comprising hydrofluoric acid.

15. The method of claim 12 wherein the cleaning further includes vapor etching.

16. The method of claim 12 further comprising forming a silicide layer over the active layer.

17. The method of claim 12 wherein the spacer comprises silicon dioxide.

18. The method of claim 12 wherein the active layer comprises strained silicon.

19. The method of claim 12 wherein the active layer has a thickness ranging between about 100 Angstroms and about 1000 Angstroms.

20. The method of claim 12 wherein the active layer comprises a silicon layer, a silicon germanium layer, and a strained silicon layer, wherein the silicon germanium layer is located over the silicon layer, and wherein the strained silicon layer is located over the silicon germanium layer.

21. The method of claim 12 wherein the active layer comprises a plurality of layers including a strained silicon layer.

22. The method of claim 12 wherein the active layer comprises a plurality of layers.

* * * * *